United States Patent [19]

Sagalyn et al.

[11] 4,050,009

[45] Sept. 20, 1977

[54] SPECTROMETER FOR EXTERNAL DETECTION OF MAGNETIC AND RELATED DOUBLE RESONANCE

[75] Inventors: Paul L. Sagalyn; Michael N. Alexander, both of Lexington, Mass.

[73] Assignee: The United States of America as represented by the Secretary of the Army, Washington, D.C.

[21] Appl. No.: 647,699

[22] Filed: Jan. 9, 1976

[51] Int. Cl.² .......................................... G01R 33/08
[52] U.S. Cl. ................................ 324/.5 AC; 324/.5 A
[58] Field of Search ................ 324/.5 R, .5 A, .5 AC

[56] References Cited

U.S. PATENT DOCUMENTS

| 3,371,271 | 2/1968 | Takeuchi | 324/.5 AC |
| 3,792,346 | 2/1974 | Gibby | 324/.5 R |

Primary Examiner—M. Tokar
Attorney, Agent, or Firm—Nathan Edelberg; Robert P. Gibson; Lawrence E. Labadini

[57] ABSTRACT

An improvement in nuclear magnetic resonance spectrometer apparatus and one consisting of a spectrometer which utilizes separate materials containing, respectively, sample and detector spin systems as opposed to one in which the sample and detector spins are contained in the same single material.

11 Claims, 2 Drawing Figures

SPECTROMETER FOR EXTERNAL DETECTION OF MAGNETIC AND RELATED DOUBLE RESONANCE

The invention described herein may be manufactured and used by or for the Government for governmental purposes without the payment of any royalties thereon or therefor.

BACKGROUND OF THE INVENTION

This invention relates to apparatus for the detection of nuclear magnetic resonance and more particularly to nuclear double resonance apparatus which enables one to use the strong resonance of one spin system to detect the weak resonance of a second spin system. The present invention also relates to other systems which can be mathematically described in a pseudospin formalism, that is, systems whose mathematical equations of motion can be cast in the same form as equations of motion for magnetic resonance and for which analogous double resonance is possible.

Nuclear magnetic double resonance spectrometers are well known to those skilled in the art. Such apparatus, for example, is disclosed in a publication, "Nuclear Double Resonance in the Rotating Frame," S. R. Hartmann and E. L. Hahn, *Physical Review*, Vol. 128, pp. 2042–2053, (1962), and in "Spin Temperature in Nuclear Double Resonance," F. M. Lurie and C. P. Slichter, *Physical Review*, Vol. 133, pp. A1108–A1122, (1964). Such spectrometers are a type of nuclear magnetic resonance (NMR) spectrometer in which two RF excitations are applied to a single material sample. The sample contains two nuclear species:D, which is indicative of an abundant species, and S, which is indicative of spins of a rare species. The two nuclear species of spin $I_D$ and $I_S$ have gyromagnetic ratios of $\gamma_D$ and $\gamma_S$, respectively, and are acted on by RF magnetic fields $2H_{1D}\cos(2\pi f_D t)$ and $2H_{1S}\cos(2\pi f_S t)$, while being located in a fixed external magnetic field $H_0$. When the frequencies $f_D$ and $f_S$ respectively designate the NMR or Larmor frequencies of the D and S spins, nuclear double resonance between the D and S spins occurs when the amplitudes of the two RF excitations are adjusted so they satisfy the condition:

$$\gamma_D H_{1D} = \gamma_S H_{1S}. \qquad (1)$$

When this condition is satisfied, the D and S spin systems in the static magnetic field $H_0$ become strongly coupled, even though the respective Larmor frequencies are widely different. The coupling occurs by means of the dipolar interaction between the D and S spins. This may be explained by noting that the precession of the S spins about $H_{1S}$ in the S-spin rotating frame causes the component of the dipolar field along the direction of the static field $H_0$ to oscillate at an angular frequency $\gamma_S H_{1S}$. When the condition of equation (1) is satisfied, this frequency of alternation is just such as to induce transitions of the D spins relative to the rotating field $H_{1D}$. These transitions of the D spins are in essence "rotary saturation" transitions, which were first described in "Nuclear Magnetic Resonance Saturation and Rotary Saturation in Solids," A. G. Redfield, *Physical Review*, Vol. 98, pp. 1787–1809, (1955). Relatively rapid phase changes of the alternating field $H_{1S}$ enable this coupling to produce transitions in the D system in a semi-continuous way. Thus, even though the resonance of the S spins may be difficult to observe directly, it can be observed indirectly by its effect and the D spins. Reference to the Hartmann and Hahn and Lurie and Slichter publications is suggested for a more exhaustive explanation of this phenomenon.

Because the interaction between the S and D spin systems is essentially a noiseless channel, the effective signal-to-noise ratio enhancement of the S spin system is proportional to the time of the measurement. In conventional detection, on the other hand, the signal-to-noise ratio enhancement is proportional only to the square root of the time of the measurement. Double resonance techniques, therefore, greatly increase the sensitivity of NMR spectroscopy.

A variation of the double resonance technique has, in addition, been described in a publication by A. Pines et al. entitled "Proton-Enhanced NMR of Dilute Spins in Solids," which appeared in the *Journal of Chemical Physics*, Vol. 59, pp. 569–590, (1973). In this variation, the D spins are made to interact with the S spins, again through satisfying equation (1), this time with the D spins being used to polarize the S spins, whereupon the NMR signal of the S spins is directly detected. The signal-to-noise ratio enhancement in this instance occurs as a result of the added polarization of the S spins. This concept, moreover, is additionally set forth in U.S. Pat. No. 3,792,346 entitled "Proton-Enhanced Nuclear Induction Spectroscopy," M. G. Gibby, et al.

While dual sample systems have been utilized heretofore see, for example, the publication entitled "EPR Study of Tetracene Positive Ion," J. S. Hyde and H. W. Brown, *Journal of Chemical Physics*, Vol. 37, pp. 368–378, (1962) at page 371 and U.S. Pat. No. 3,487,293, T. Seki, et al. entitled "Method of Field/Frequency Control During Sample Exchanges," double resonance methods have heretofore been accomplished with spectrometers which are designed to operate on the assumption that the S and D spins are in the same piece of material.

SUMMARY

Briefly, the subject invention is directed to an improvement in double resonance spectrometers and consists of providing separate materials containing the S and D systems, respectively, surrounded by suitable RF coil configurations characterized by the axes of the coils lying in a plane perpendicular to an external, substantially unidirectional and DC magnetic field.

DESCRIPTION OF THE PREFERRED EMBODIMENTS

Figure 1:
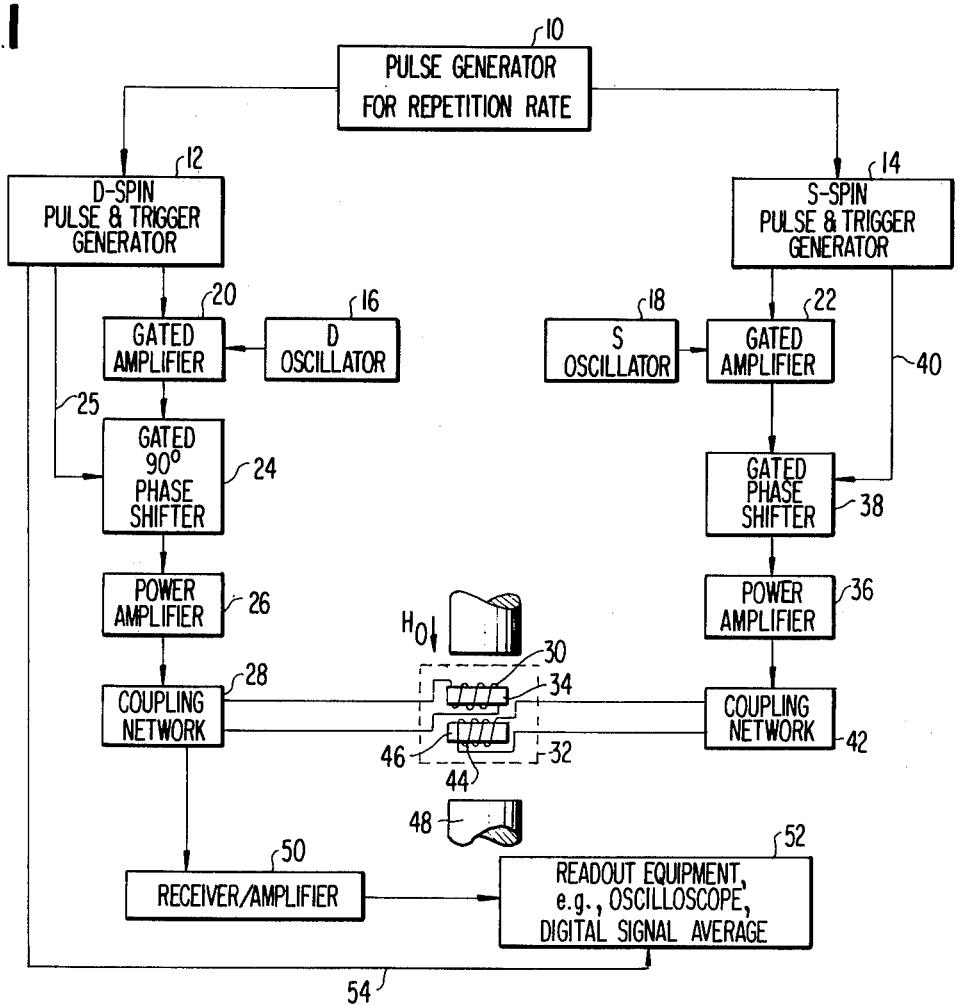
FIG. 1 is a block diagram illustrative of a Hartmann-Hahn type apparatus incorporating the subject invention.

The block diagram in FIG. 1 is illustrative of one typical type of double resonance spectrometer apparatus, and is similar to that disclosed in the Hartmann-Hahn reference noted above. The apparatus shown includes a pulse generator 10 for providing pulse signal outputs at a base repetition rate, which are respectively applied to a "D spin" pulse and trigger generator 12 and an "S spin" pulse and trigger generator 14. A pair of oscillators 16 and 18 operating at RF frequencies $f_D$ and $f_S$, respectively, have their outputs applied to gated amplifiers 20 and 22. A gated 90° phase shifter 24 operated by a signal applied via signal lead 25 from the generator 12 is used to change the phase of the RF pulses having frequency $f_D$. The pulses are fed to a power amplifier 26, whose output is applied to a coupling network 28 which is connected to an RF coil 30 located in a double nuclear magnetic resonance probe 32. The coil 30 encloses first material 34 including a D spin system.

In a like manner, gated pulses of frequency $f_S$ are applied to a power amplifier 36 by way of a gated phase shifter 38, which is adapted to be operated in accordance with a signal from the pulse and trigger generator 14 applied by means of the signal lead 40. The output of the power amplifier is applied to a coupling network 42, which connects to a second coil 44 in the probe 32 which surrounds the second material 46 containing the S spin system.

Figure 2:
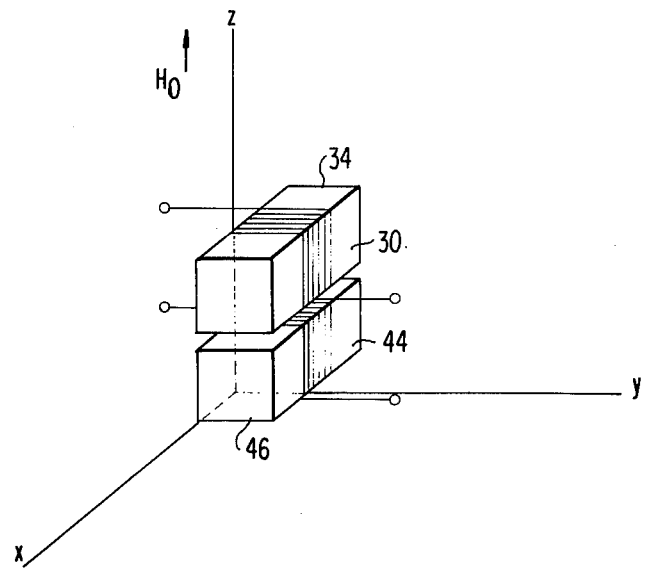
FIG. 2 is a diagram helpful in providing an understanding of the subject invention.

The probe 32 is between the pole pieces of a magnet 48 which may be, for example, an electromagnet for providing a substantially unidirectional and time-independent magnetic field $H_0$ through the probe 32 and its coil 30 and 44 which are arranged as shown in FIG. 2. FIG. 2, moreover, illustrates the relationship of the coils 30 and 44 relative to the direction of the magnetic field $H_0$ from the viewpoint of an orthogonal coordinate system. As shown, the external magnetic field $H_0$ is directed along the z axis. The axes of both RF coils 30 and 44 are shown located parallel to the x axis. It should be pointed out, however, that it is necessary only that the axes of the two coils be parallel to the $x$-$y$ plane, i.e., in such a way that they are perpendicular to the direction of the $H_0$ field; the axes of the two coils 30 and 44 need not be parallel to one another.

It should also be pointed out that more than two pieces of material with an associated coil can be utilized when desirable. For example, another detector (with D spins in the material) with its associated coil could be placed below the sample with S spin material 46 in the FIG. 2, and connected so that its RF signal adds to the RF signal from the detector material 34. Similarly, other pieces of sample material might be added. Although the sample and detector materials 46 and 34, respectively, are shown in the shape of rectangular solids, this is not meant to be interpreted as a form of limitation, since any particular shape may be used, as certain selected shapes may be more desirable than others. The detector and sample coils, for example, might be cylindrical solenoids, the detector and sample materials being cylindrical in shape; the detector and sample coils might also be concentric solenoids. The solenoid coil configuration is likewise not meant to be considered as a limitation; what is necessary is that the associated magnetic fields produced by the respective coils surrounding the respective materials have a field pattern similar to that provided by the rectangular solenoids shown in FIG. 2 and discussed above. The sample or detector materials may be in solid or liquid state.

In addition, the apparatus disclosed in FIG. 1 includes receiver apparatus 50 connected to the coupling network 28, which is adapted to be responsive to the free induction decay signal sensed by the detector coil 30. The output of the receiver 50 is applied to selected readout apparatus 52 which, for example, may be an oscilloscope or chart recorder. The apparatus 52, moreover, may be synchronized with the D pulse and trigger generator 12 by means of a "sync" signal applied over circuit lead 54.

The system shown in FIG. 1 operates in the following manner. The simplest mode of operation, conceptually, exists when the S and D NMR frequencies satisfy the resonance condition, i.e., $\gamma_S H_0 = 2\pi f_S$ and $\gamma_D H_0 = 2\pi f_D$. First both the S and D spin systems are allowed to acquire a large degree of polarization. This is accomplished by means of the magnetic field $H_0$ provided by the magnet 48, the simplest procedure being to allow the spins to achieve thermal equilibrium populations. The pulse and trigger generator 12 actuates the gated amplifier 20 whereupon the oscillator 16 for the D system, operating at a frequency $f_D$, applied a signal to the power amplifier 26, producing an RF amplitude $2H_{1D}$, where $H_{1D}$ is larger than the "local field in the rotating frame" of the D spins. This pulse is applied to the D spin material 34 for a time $t = \pi/2 \gamma_D H_{1D}$, rotating the D-spin magnetization through $\pi/2$ radians, i.e., 90° (thus it is referred to as a 90° pulse), by means of a coupling network 28 and the coil 30.

Next $H_{1D}$ is brought parallel to the magnetization of the D spin system. This may be accomplished by gating the phase shifter 24 by means of the generator 12 immediately after the 90° pulse has been applied. The net effect of this "spin-locking" is to take the D-spin magnetization which is originally parallel to the $H_0$ field and lock it along the RF field as seen from the "rotating frame" (The RF field is $H_{1D}$, and the magnetization is parallel to $H_{1D}$). The particular method described above for bringing the D-spin magnetization parallel to the RF field is not to be considered in a limiting sense, however, since other techniques known to those skilled in magnetic resonance, may also be used, e.g., that described in the Lurie and Slichter publication cited above.

After the D-spins are spin-locked in their RF field, the S-spin system in the second material 46 is next brought into contact with the D-spin system. This is accomplished by applying a strong RF field at the Larmor frequency $f_S$ of the S spins, with an amplitude $2H_{1S}$ satisfying equation (1). The RF field for the S-spin system is provided by means of the generator 14 gating the amplifier 22, whereupon the oscillator 18 is coupled to the power amplifier 36, which provides an RF amplitude adjusted to satisfy equation (1). Satisfaction of equation (1) establishes contact between the S and D spin systems and permits them to interact. The precession of the S spins about $H_{1S}$ as seen, for example, from the "rotating frame" of the S spin system produces an oscillating magnetic field which is parallel to the z direction in FIG. 2, and having a frequency $\gamma_S H_{1S}/2\pi$.

Because of the orientations of the detector coil 30 and the sample coil 44 shown in FIG. 2, an alternating magnetic field is produced. The alternating field produced by the sample material 46, as described immediately above, can, because it is in the z direction, affect the spin-locked D spins in the detector material 34. This alternating magnetic field causes D-spin transitions relative to the rotating field $H_{1D}$. These transitions are essentially rotary saturation transitions, as described in the Redfield publication cited above, and they decrease the amplitude of the D spin magnetization relative to what it would be if equation (1) were not fulfilled. The presence of the S spins is detected in this invention by its effect on the D spins, i.e., by the decrease of the D spin magnetization along the rotating field $H_{1D}$.

Determination of a quantity proportional to the D spin magnetization is accomplished in the following manner (It should be noted, however, that if the constant of proportionality is desired, it can be established readily by calibration.) The RF pulse for the S spin system is terminated, and then the RF pulse for the D spin system is terminated. The D spin free induction decay in the material 34 induces an RF signal in the coil 30. This signal goes to the receiver amplifier 50 via the coupling network 28, and is read out by the equipment 52.

Optimization of this invention to some degree depends upon the spin-spin relaxation time $T_{2S}$ of the S spins in the sample material 46. This is because the time over which the alternating magnetic field produced by the S spins persists is characterized by $T_{2S}$. Additionally, if the material 46 is a solid, for example, and $T_{2S}$ is much shorter than $T_{1S}$, where $T_{1S}$ is the spin-lattice relaxation time of the S spins in material 46, one may periodically produce 90° phase shifts in the RF signal applied to the material 46 via the coupling network 42 and the coil 44. The phase shift is provided by the trigger generator 14 activating the phase shifter 38. Another optimization technique would be prolongation of the S spin free induction decay, by operation at the "magic angle" in the rotating frame of the S spin system. Such prolongation of free induction decays has been described in a publications by M. Lee and W. I. Goldburg, entitled "Nuclear-Magnetic-Resonance Line Narrowing by a Rotating rf Field," *Physical Review*, Vol. 140, pp. A1261–A1271 (1965). In the event that the latter method is desired, one would replace $H_{1S}$ in equation (1) by the "effective field in the rotating frame" of the S spins. Thus the inventive concept is not limited to operating exactly at the Larmor frequencies of the S and D spin systems. In a liquid sample, for example, $T_{2S}$ would likely be comparable to the spin-lattice relaxation time, and such optimization techniques might not be considered necessary.

A mathematical analysis of the invention now follows. The precession of the S spins about the rotating magnetic field $H_{1S}$ produces an alternating magnetic field which occurs outside the material 44. Let the value of this magnetic field in the detector material 34 be represented as $H_{SD}\cos(\gamma_S H_{1S} t)$, and assume that equation (1) is satisfied.

The conditions mathematically describing the nuclear magnetization of the detector material 34 can be expressed by the differential equation:

$$dM_D/dt = -2WM_D \quad (2)$$

where $t$ denotes time. The transition probability per unit time, $W$, can be determined by standard perturbation theory outlined in chapter 2 of the *Principles of Nuclear Magnetism*, A. Abragam, Oxford Universiy Press, 1961. If the spin $I_D$ of the D spins has the value $\frac{1}{2}$, then at exact resonance, the transition probability per second is given by equation $$W = \gamma_D H_{SD}^2/\delta_D \quad (3)$$

where $\delta_M$ is the NMR line width (in units of magnetic field) of the D spins. For $I_D$ not equal to $\frac{1}{2}$, the transition probability can also be determined, the only difference from equation (3) being a slightly different numerical factor. The inventive concept set forth in the present specification applies to all nonzero spin or magnetic moment for the I and S systems.

$H_{SD}$ may be determined approximately (see Abragam, op. cit., Chapter 2) from the thermal equilibrium spin susceptibility $\chi_0$ of the S spin system according to the following expression:

$$H_{SD} = 4\pi\chi_0 H_0, \text{ and} \quad (4)$$

$$\chi_0 = N_S \gamma_S^2 \hbar^2 I_S(I_S + 1)/3kT_S \quad (5)$$

Where $N_S$ = the number of S spins in the sample material 46, $I_S$ = the spin quantum number of sample spins, $T_S$ = the sample temperature in degrees Kelvin, $k$ = Boltzmann's constant, and $\hbar$ = Planck's constant divided by $2\pi$. Substituting equations (3), (4), (5) into equations (2), the following expression results:

$$dM_D/dt = -2M_D(\gamma_D/\delta_D)[4\pi N_S \gamma_S^2 \hbar^2 I_S(I_S+1) \times H_0/3kT_S]^2 \quad (6)$$

In order to determine the sensitivity of the spectrometer utilizing separate materials 34 and 46 for the detector and sample respectively, let:

$$|dM_D/M_D| \simeq |\Delta M_D/M_D| = 1/S \quad (7)$$

where S is the signal-to-noise ratio of the detector material in a standard NMR experiment. Assuming that $dt \simeq \Delta t$ and further that the spectrometer operates in such a way that the detector magnetization change $\Delta M_D$ can barely be detected, then $N_S$ in equation (6) will yield the smallest number of spins in a sample that can be detected and is expressed as:

$$N_S^{min} = (3k/4\pi\hbar^2)[T_S/\gamma_S^2 I_S(I_S+1)H_0] \times \sqrt{\delta_D/2\gamma_D \Delta t\, S} \quad (8)$$

where $\Delta t$ is the time interval required to produce a fractional change in the magnitude of $M_D$ equal to $1/S$.

It is usually the case in double resonance apparatus that $N_S$ is much smaller than the total number of atoms $N_H$ in the sample material 46. In such instance, the fractional detectivity $f$ may be written as:

$$f = (3k/4\pi\hbar^2 N_H)[T_S/\gamma_S^2 I_S(I_S+1)H_0](1/F) \quad (9)$$

where the figure of merit F for the detector is:

$$F = \sqrt{2\gamma_D T_{1D} S/\delta_D} \quad (10)$$

and $T_{1D}$ is the detector rotating frame spin-lattice relaxation time. The detector rotating frame spin-lattice relaxation time $T_{1D}$ has been used because it imposes an upper limit on the experimental time.

Equation (9) therefore provides the smallest fraction that can be detected. From equation (10), it becomes evident that the sensitivity of the spectrometer reflected in the figure of merit F, indicates that greater detectivity occurs for small values of $\delta_D$ and use of detector material having very long rotating frame spin-lattice relaxation times $T_{1D}$.

Where, for example, the sample material 46 is titanium metal containing a small amount of hydrogen with the desirability of hydrogen to be detected, the use of a liquid material for a detector can permit small values of $\delta_D$. A liquid detector including fluorine nuclei operating under the conditions wherein $T_{1D} = 10,000$ seconds, S = 10,000, $\delta_D = 1/1000$ gauss, $T_S = 4.2°K$ and $H_O = 20$ kilogauss provides a detectivity $f$ equal to $2.8 \times 10^{-6}$, meaning that 2.8 ppm hydrogen can be detected. This is comparable to the greatest sensitivities achieved by prior art nuclear magnetic double resonance apparatus.

In previous double resonance spectrometers, the rate of transfer of energy from the S spins to the D spins and consequently the sensitivity would be limited by "spin diffusion" and energy transfer process which operates in small steps of 1nm (1 × 10$^{-9}$ meters) distance or less. The present invention is not limited by the spin diffusion "bottleneck" existing because energy transfer occurs over relatively long distances, since each S spin irradiates most of the detector volume.

Previous double resonance spectrometers, moreover, have been limited by the necessity of having both the S and D spin systems in the same material. Thus one could analyze S spins only in materials containing both S and D spins — a limitation which precluded the analysis of the many materials containing S spins (i.e., spins whose properties one wished to detect and analyze) but which did not contain suitable D (detector) spins. This invention, because it utilizes separate "sample" and "detector" materials, permits the analysis of S spins whether or not other spins are present in the "sample" material. In addition, one can, by suitable choice of the material containing the D spins, optimize the detection.

It should be pointed out that alternative spectrometer designs consistent with the principles set forth in this specification will allow for further optimization, for example, if liquid helium — 3 is used as a cryogenic coolant, the coolant and the detector material can be one and the same with the detector coil 30 being simply immersed in the liquid helium in the manner well known to those skilled in the art.

Additionally, the subject invention which has been described with specific reference to nuclear magnetic double resonance, it should be pointed out that the sample and/or detector spins may, when desirable, comprise electron spins. If electron spins are utilized, the coils utilized in conjunction with the separate sample and detective materials are replaced by appropriate higher frequency electronic components.

The invention may be applied to other systems whose physics can mathematically be described in a pseudospin formalism, so that the mathematical equations of motion can be cast in the same form as the magnetic resonance equations of motion. Paraelectric resonance and certain optical resonance phenomena come to mind as two possible examples. In such cases, changes in the details of the apparatus would be made in accordance with the mathematical transformations used to reduce the equations of motion to the magnetic resonance equations. The invention may also be applied not only to the double resonance detection method as described above, but also to double resonance polarization of S spins by D spins with the conventional detection of the S spins subsequent to the polarization. The relationship between the two forms of double resonance is well known, being set forth, for example, in the aforementioned U.S. Pat. No. 3,792,346.

Having thus set forth what is at present considered to be the preferred embodiment of the subject invention, we claim:

1. In double resonance spectrometer apparatus including, a probe containing first abundant and second rare spin systems which are adapted to undergo gyromagnetic transitions due to dipolar coupling between abundant and rare spins at respective different gyromagnetic resonance frequencies, means for producing a unidirectional polarizing magnetic field through said probe in a predetermined direction, means for producing resonance transitions in both spin systems at different frequencies comprising first and second means respectively establishing first and second alternating magnetic fields substantially perpendicular to said predetermined direction of the polarizing magnetic field and substantially at the respective gyromagnetic frequency of said first and second spin systems, and means responsive to the resonance of said first spin system for detecting the resonance in said second spin system, the improvement comprising: first material containing said first spin system; and second but separate material containing said second spin system, wherein said first means establishing said first alternating magnetic field influences said first material and said second means establishing said second alternating magnetic field influences said second material and wherein said first and second means comprises coils respectively surrounding said first and second material.

2. The apparatus as defined by claim 1, wherein the axes of said first and second coils lie in mutually parallel planes substantially perpendicular to said predetermined direction of said polarizing magnetic field.

3. The apparatus as defined by claim 2 wherein said first and second materials comprise solid material.

4. The apparatus as defined by claim 2 wherein said first and second materials comprises liquid material.

5. The apparatus as defined by claim 2, wherein said first material comprises liquid material and said second material comprises solid material.

6. The apparatus as defined by claim 2 wherein said first material comprises solid material and said second material comprises liquid material.

7. The apparatus as defined by claim 2, wherein said first and second materials contain nuclei having non-zero spin.

8. The apparatus as defined by claim 2, wherein said first material contains hydrogen nuclei.

9. The apparatus as defined by claim 4, wherein said first material contains fluorine nuclei.

10. The apparatus as defined by claim 1, wherein said first material comprises liquid material and wherein said first means establishing said first alternating magnetic field includes a coil immersed in said liquid material.

11. The apparatus as defined by claim 7 wherein said second material comprises solid material and said second means establishing said second alternating magnetic field includes a coil surrounding said solid material and being immersed in said liquid material.

* * * * *